United States Patent [19]

Hulick

[11] Patent Number: 4,804,931
[45] Date of Patent: Feb. 14, 1989

[54] DIGITAL AMPLITUDE MODULATOR - TRANSMITTER

[75] Inventor: Timothy P. Hulick, Schwenksville, Pa.

[73] Assignee: Acrodyne Industries, Inc., Blue Bell, Pa.

[21] Appl. No.: 132,207

[22] Filed: Dec. 11, 1987

[51] Int. Cl.$^4$ .............................................. H03C 1/00
[52] U.S. Cl. .................................. 332/31 R; 332/41; 375/59; 455/108
[58] Field of Search .................. 332/31 R, 41, 48; 455/102, 108; 375/59

[56] References Cited

U.S. PATENT DOCUMENTS

| | | |
|---|---|---|
| 3,490,054 | 1/1970 | Seidel . |
| 3,678,415 | 7/1972 | Kuroda . |
| 3,827,001 | 7/1974 | Laughlin . |
| 3,869,585 | 3/1975 | Snyder . |
| 4,182,996 | 1/1980 | Spence . |
| 4,514,699 | 4/1985 | Kariatsumari et al. . |
| 4,534,040 | 9/1985 | Thapar . |
| 4,571,549 | 2/1986 | Lods et al. . |
| 4,580,111 | 4/1986 | Swanson ............................. 332/41 |
| 4,654,608 | 3/1987 | Minarik et al. ................... 332/41 X |
| 4,661,948 | 4/1987 | Shapiro et al. . |

Primary Examiner—Eugene R. LaRoche
Assistant Examiner—Robert J. Pascal
Attorney, Agent, or Firm—Mason, Fenwick & Lawrence

[57] ABSTRACT

A digital amplitude modulator for use in transmitting information signals in the context of AM audio and AM video. The amplitude modulator/transmitter basically consists of a predetermined number of quadrature hybrid power devices configured as combiners and arranged in cascade so that the output of one combiner becomes one of the inputs of its adjacent combiner. An analog signal source such as a microphone or a video generator, produces an analog signal that passes through an analog-to-digital converter. The output of the A/D converter appears on datelines. The data consists of four-bit words. However, it is contemplated that in order to improve the quality of the signals being transmitted, 12- or 16-bit words or any arbitrary n are employed. Each of the bits from the least significant bit (LSB) to the most significant bit (MSB) is fed into a gate. In turn, each of the gates has its output connected to one of the input ports of one of the combiners. The gate is also connected to the output of an amplifier which receives an RF signal from an RF signal generator. The output of the gate representing the LSB has a value that is placed into an input port of the LSB combiner. The output of the gate to the left of the LSB gate contains a value that is twice that of the output of the LSB gate. In fact, the output of each advanced gate is twice that of the preceding gate. Thus, the output of each gate represents a binary weighted power signal and the combined signal appearing at the output of the MSB combiner represents the sum of the power signals fed into the various combiners. This output signal is fed to a load for transmission. Typically, the load consists of an antenna with conventional filtering.

15 Claims, 5 Drawing Sheets

DIGITAL AMPLITUDE MODULATOR - TRANSMITTER

BACKGROUND OF THE INVENTION

The present invention relates to modulators, in general, and to an amplitude modulator that is capable of generating pseudo-continuous amplitude modulation at any modulation index between zero and one within a vast array of carrier frequencies using almost any class of amplifier, in particular.

FIELD OF THE INVENTION

Amplitude modulation is one of the oldest forms of impressing information onto an "electromagnetic carrier" wave of energy with its beginnings taking root in the early days of spark transmission. In a general way, linear amplitude modulation (AM) can be defined as a system where a carrier wave has its amplitude varied linearly by some information signal. More precisely, a waveform is linearly amplitude modulated by a given information signal if the partial derivative of that waveform, with respect to the information signal, is independent of the information signal.

Amplitude modulation arrived with the adoption of Morse Code and later with International Morse Code. Still later, voice amplitude modulation which has come to be known simply as AM, came into existence. AM is a technique by which speech and music are impressed on radio waves. The sound waves from a studio are converted into electrical signals by microphones and these electrical signals are used to vary the amplitude, that is, the distance from peak to trough of a radio carrier wave generated at a constant frequency in the transmitting station. As a result, the signal radiated by the station varies in amplitude in step with the variations in the loudness and pitch of the sound in the studio. In the AM receiver, the amplitude variations of the radio signal are separated from the carrier wave by a process known as demodulation, and after further amplification are fed to a loudspeaker.

Amplitude modulation was the first technique to be used when broadcasting began in the United States and Europe in the early 1920's. The AM method is still used for broadcasting in the medium wave and short wave bands. The alternative, FM radio, occupies considerably more bandwidth, not affordable at the lower carrier frequency; therefore, is restricted to VHF broadcast and TV aural.

AM usually refers to full carrier amplitude modulation with a single set of in-phase sidebands containing the information to be transmitted and received, but it should be understood that any modulation system which causes the instantaneous composite amplitude of the waveform to be varied in accordance with the information transmitted may be termed AM. This includes suppressed carrier single sideband and vestigial sideband broadcasting visual television as well.

AM can be generated in many ways, but always may be expressed by the trigonometric density as follows:

$$(1+\cos \omega_m t) \cos \omega_c t = \cos \omega_c t + \tfrac{1}{2} \cos (\omega_c - \omega_m)t + \tfrac{1}{2}\cos (\omega_c + \omega_m)t \quad (1)$$

where:
m = modulation frequency
c = carrier frequency
t = time when the modulation form is a simple sine-wave. More complex modulation waveforms may be expressed as a Fourier series of sine or cosine terms, but the carrier and sideband terms would retain the same form and the modulation index, m, (value between zero and 100%) would modify the amplitude of the sum and difference terms. Any method used to generate the carrier and associated sidebands expressed in equation (1) may be used as a method to generate AM.

U.S. Pat. No. 4,580,111 (Swanson) relates to an amplitude modulation system using digitally selected carrier amplifiers. An amplitude modulator is disclosed which generates an amplitude modulated carrier signal by selectively combining varying numbers of other carrier signals. A circuit is included which provides plural carrier signals of like frequency and phase where the number of carrier signals being provided is dependent upon the number of digital levels chosen. A combiner circuit made up of a plurality of transformers combines the plural carrier signals to provide a combined signal which is the desired amplitude modulated carrier signal. Other combiner circuits include voltage addition combiners, current addition combiners and transmission line combiners. In one embodiment, the carrier signals are combined and are all equal in amplitude. In another embodiment, the amplitudes of some of the carrier signals are weighted in a binary progression. In yet another embodiment, the carrier signals are all frequency modulated so that the output signal has with a varying frequency and amplitude.

Thus, it can be seen that digital AM transmitters for the medium wave band already exist, but the technology that makes them possible does not solve all of the problems associated with digital AM transmission. Power combiners found in digital AM transmitters do not offer port-to-port isolation, i.e., no reject loads are associated with the power combiner which, in the prior art, is simply a transformer with a single secondary and many primaries. Nor is an isolated combiner necessary at medium wave where switch-mode RF amplifiers make up the modulator RF source. This source impedance is either zero when gated ON or approaching infinity when gated OFF. The present state of the transistor art is that switch-mode amplifiers (class D) used exclusively by Swanson are not possible at carrier frequencies much higher than 2 MHz. To effect a digital modulator at any RF carrier frequency, RF source impedances are finite requiring port-to-port isolation in the power combiner.

There is thus a need for an amplitude modulation system which is capable of operation at any carrier frequency using any of many classes of amplifiers as the RF source. The present invention is directed toward filling that need by providing a new method and apparatus for generating pseudo-continuous amplitude modulation at any modulation index between zero and one (full 100%) at any carrier frequency using any class of amplifier, (Classes A, B, AB, C, D, H, S, etc.) as an RF source.

SUMMARY OF THE INVENTION

The present invention relates to a digital amplitude modulator for use in transmitting information signals in the context of AM audio and AM video or any other modulation source for the purpose of generating amplitude modulation.

An amplitude modulator/transmitter embodying the teachings of the present invention basically consists of a predetermined number of quadrature hybrid power devices configured as combiners and arranged in cascade so that the output of one combiner becomes the input of its adjacent combiner. The construction and operation of a quadrature hybrid device will be described in greater detail hereinafter. However, for purposes of the present discussion, a quadrature hybrid combiner is a four-port device in which the ports are divided into two inputs, an output and an isolated port. The two inputs receive two signals of a given amplitude that are 90° split in phase. They are combined at the output and provide a signal having an amplitude that is the sum of the two in-coming amplitudes, when they are equal in amplitude and having the same phase as one of the input signals.

An analog signal source such as a microphone or a video generator, produces an analog signal that passes through an analog-to-digital converter. The output of the A/D converter appears on datalines. The data consists of four-bit words. However, it is contemplated that in order to improve the quality of the signals being transmitted, 12- or 16-bit words (or any arbitrary number) are employed. Each of the bits from the least significant bit (LSB) to the most significant bit (MSB) is fed into a gate. In turn, each of the gates has its output connected to one of the input ports of one of the combiners. The gate is also connected to the output of an amplifier which receives an RF signal from an RF signal generator.

The output of the gate representing the LSB has an initial value that is placed into an input port of the LSB combiner. The output of the gate to the left of the LSB gate contains a value that is twice that of the output of the LSB gate. In fact, the output of each advanced gate is twice that of the preceding gate. Thus, the output of each gate represents a binary weighted power signal and the combined signal appearing at the output of the MSB combiner represents the sum of the power signals fed into the various combiners. This output signal is fed to a load for transmission. Typically, the load consists of an antenna with conventional filtering.

When the digital amplitude modulator just described is used for television visual transmission, vestigial sideband transmission is not yet possible. However, a high level vestigial filter could be constructed to pass the appropriate spectral components of the double sideband signal to be compatible with NTSC television. This is a legal requirement as opposed to a technical one.

It is a primary object of the present invention to provide an amplitude modulator/transmitter that uses any class of amplifier to provide the RF signal sources.

It is another object of the present invention to be able to generate AM at any carrier frequency since switchmode signal sources are not necessary.

It is yet another object of the present invention to provide an improved amplitude modulator/transmitter.

It is another object of the present invention to provide an amplitude modulation technique employing a series of quadrature hybrid power combiners.

It is still another object of the present invention to provide a high efficiency amplitude modulation technique.

It is yet another object of the present invention to produce an amplitude modulator that is perfectly linear in its operation within digital quantization error.

Further features of the invention and advantages offered thereby, are described in detail hereinafter with reference to preferred embodiments of the invention illustrated in the accompanying drawings.

BRIEF DESCRIPTION OF THE DRAWINGS

FIG. 4A shows the signal paths when port 2 is terminated in a short circuit and FIG. 4B shows the signal paths when port 2 is terminated in an open circuit.

DESCRIPTION OF THE PREFERRED EMBODIMENTS

The present invention relates to a digital amplitude modulator for use in transmitting information signals in the context of AM audio and AM video or any other modulation sources for the purpose of generating amplitude modulation.

Figure 14:
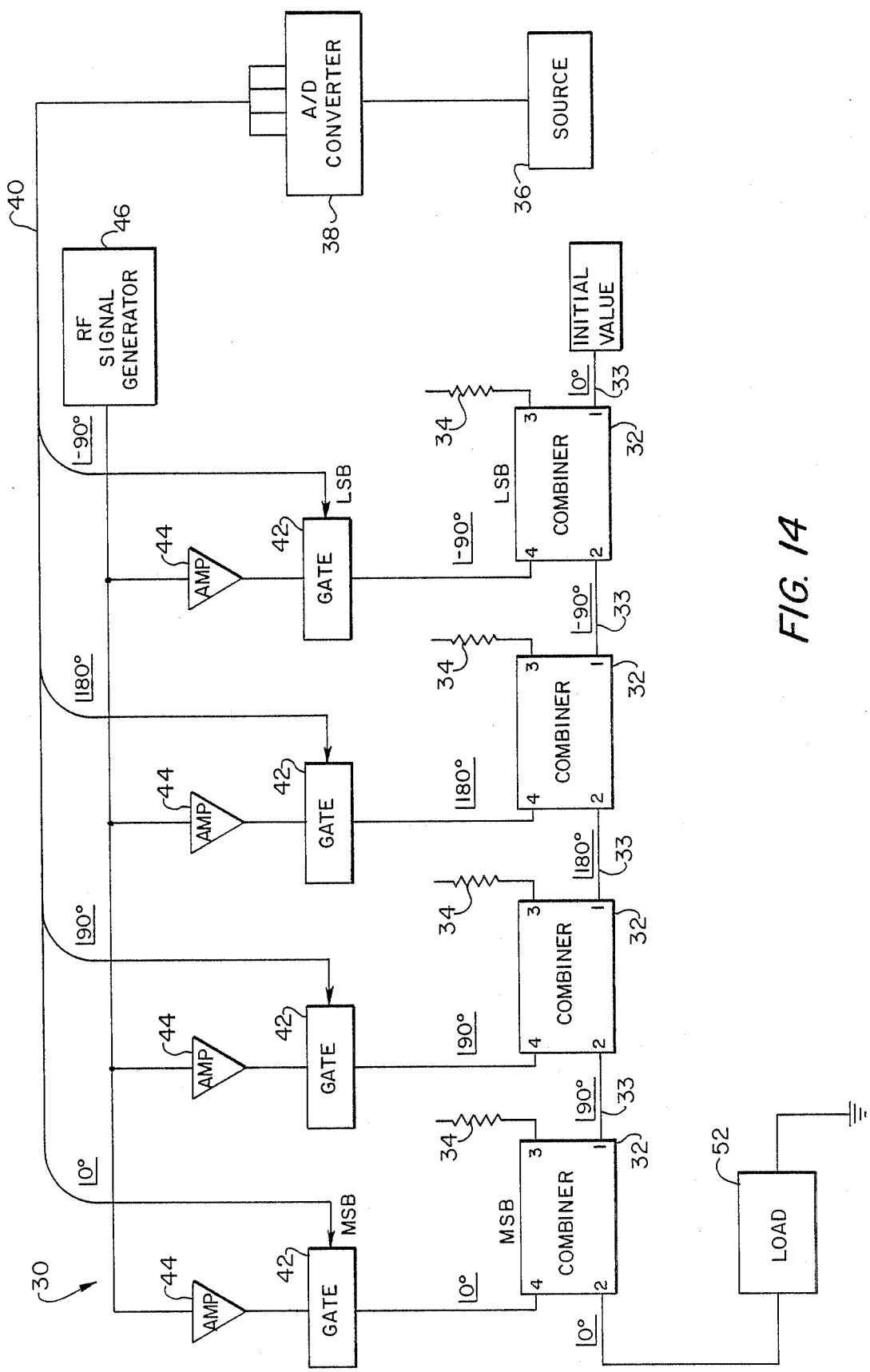
FIG. 14 is a schematic diagram showing a preferred embodiment of an amplitude modulation system for transmitting an information signal and incorporating the teachings of the subject invention.

An amplitude modulator/transmitter embodying the teachings of the present invention is generally illustrated in FIG. 14. The amplitude modulator 30 basically consists of a predetermined number of quadrature hybrid power devices 32 configured as combiners and arranged in cascade so that the output of one combiner becomes one of the two inputs of its adjacent combiner. In the embodiment of FIG. 14, four combiners are shown for ease of understanding. However, it is contemplated that a greater number of combiners such as 12 or 16 be used.

The construction and operation of a quadrature hybrid device will be described in greater detail hereinafter. However, for purposes of the present discussion, a quadrature hybrid combiner is a four-port device in which the ports are divided into two inputs, an output and an isolated port. The two inputs receive two signals of a given amplitude that are 90° split in phase. They are combined at the output and provide a signal having an amplitude that is the sum of the two in-coming amplitudes and having the same phase as one of the input signals.

As shown in FIG. 14, ports 1 and 4 represent input ports, port 3 represents an isolation port to which is attached a resistor for dummy load 34. Port 2 defines the output port of each of the combiners.

An analog signal source such as a microphone or a video generator, produces an analog signal that passes through an analog-to-digital converter 38. The output of the A/D converter appears on datalines 40. With the examples shown in FIG. 14, the data consists of four-bit words. As stated before, this is for purposes of clarity of the explanation of the invention and it is contemplated that in order to improve the quality of the signals being transmitted, 12- or 16-bit words are employed. The choice depends on the accuracy of analog signal synthesis. Each of the bits from the least significant bit (LSB) to the most significant bit (MSB) is fed into a gate 42. In turn, each of the gates has its output connected to port 4 of one of the combiners. The gate is also connected to the output of an amplifier 44 which receives an RF signal from an RF signal generator 46. It is contemplated, that under certain circumstances, a direct digital signal may be fed to gates 42 without the need for A/D converter 38 should the modulating signal already exist in binary form.

As oriented in FIG. 14, the output of gate 42 representing the LSB has a value that is placed into port 4 of the appropriate combiner. Port 1 of the same combiner receives carry input 33 as defined hereinafter. The output of the gate to the left of the LSB gate contains a value that is twice that of the output of the LSB gate. In fact, the output of each gate moving to the left is twice that of the preceding gate to its right. Thus, the output of each gate represents a binary weighted power signal and the combined signal appearing at the output of the MSB combiner represents the sum of the power signals fed into the various combiners. This output signal is fed to a load 52 for transmission. Typically, the load consists of an antenna with conventional filtering.

In order to practice the present invention, knowledge of the construction and operation of quadrature hybrid power devices is desirable. The basic quadrature hybrid power device finds favor in microwave applications because of the device's small size at microwave frequencies and because the device is a simple practical way of adding the RF power output of many signal sources together to effect a much larger signal than that available from a single source. It tends to be unknown to the RF designer below about 50 MHz because the combiner gets to be prohibitively large and expensive, although its theory applies to all RF frequencies. Throughout this application, the quadrature hybrid power combiner/splitter is sometimes referred to as a "hybrid", a "combiner", a "splitter" or a combination of these terms.

A quadrature hybrid power device is a four-port device which consists of two (or more) parallel conductors placed inside a common outer conductor such that the two lines share the same E and H fields. In a preferred embodiment, the lines are made of a metallic material such as solid copper of circular cross-section. However, hollow lines and lines of non-circular cross-section are also suitable. This basic definition places no restriction on such parameters as characteristic impedance of the coaxial arrangement or where the terminations of the conductors are located, but simply stated, two conductors sharing a common field will mutually induce current in each other according to some physical law. A vector analysis of the quadrature hybrid device may be found in most NAB handbooks in the television section. For the purpose of the present discussion, it is sufficient to discuss the quadrature device's significant properties.

Figure 1:
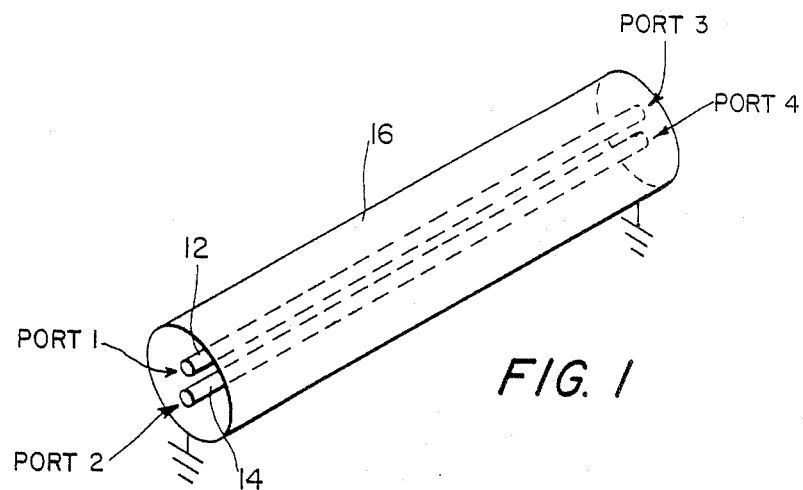
FIG. 1 is a schematic perspective view showing two coupled lines inside a common outer conductor to form a quadrature hybrid four-port device.
Figure 2:
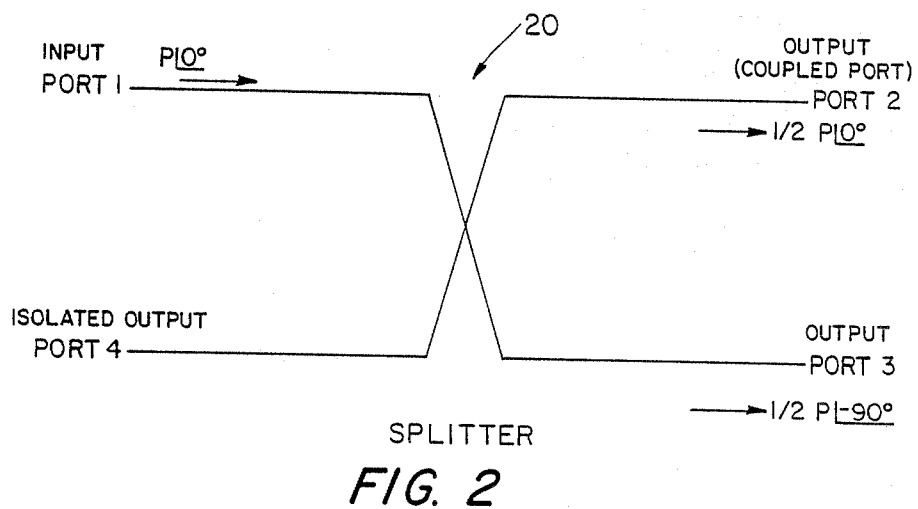
FIG. 2 is a schematic representation of the quadrature hybrid power device of FIG. 1 configured as a splitter.

In FIG. 1, a quadrature hybrid power device is schematically illustrated as consisting of a pair of adjacent conductive lines 12 and 14 placed at the center of a common outer conductor or shield 16 that is grounded. The four ports 1 through 4 generally terminate in conventional RF connectors which are not shown. Schematically, the quadrature hybrid device is shown in FIG. 2 in the configuration of a splitter 20. If the splitter is correctly dimensioned for a given frequency, the input power at port 1 will be equally split at output ports 2 and 3. The output signal at port 2 will have the same phase as the input signal at port 1 (except for very small propagation delays) but the output signal at port 3 will be at $-90°$ with respect to the phase of the signals at ports 1 and 2. Whether or not power is split equally within splitter 20 depends on the electrical length of the conductor lines 12 and 14 and the degree of coupling governed mostly by the shape of the lines and their proximity to each other. Characteristic impedance depends on the cross-sectional geometry of the whole structure of the quadrature hybrid device. If the two lines 12 and 14 and outer conductor 16 are circular in cross-section, such as with copper pipe or tubing, the ratio of the inside diameter of the outer conductor 16 to the outside diameter of one of the lines 12 or 14 should be 4.0 for a characteristic impedance of 50 ohms at each of the four ports 1 through 4. If the two lines are circular in cross-section and the outer conductor is square in cross-section, the ratio of the inside length of one side of the outer conductor to the outside diameter of one of the lines should be 3.5 for a characteristic impedance of 50 ohms. The degree of coupling is determined by the spacing between the lines while the length of each enclosed line determines the frequency range over which the degree of coupling is maintained to be reasonably constant. It should be pointed out that the quadrature device operated as a combiner will maintain the same degree of coupling over an octave bandwidth within a few tenths of a decibel (dB) while maintaining a nearly constant 90° phase shift to the quadrature port. The length of a quadrature device is equal to:

$$\lambda/4$$

where $\lambda$ is the wavelength at the geometric center frequency of interest over an octave bandwidth. Outside the octave bandwidth, coupling decreases in both directions and the phase angle departs greatly from 90°.

Figure 3:
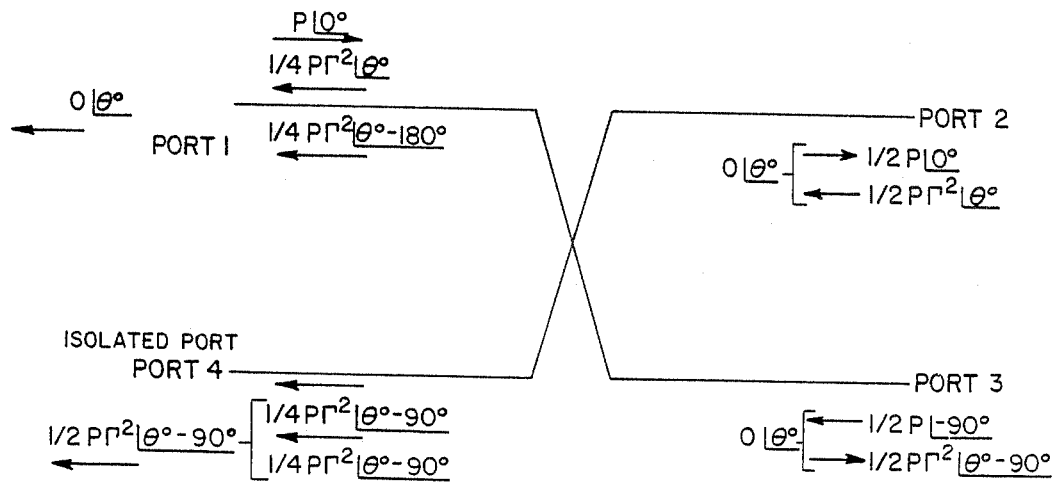
FIG. 3 is a schematic diagram of the device of FIG. 1 to explain the operation of the device where there is a mismatch at ports 2 and 3.

For the splitter in FIG. 2, if ports 2 and 3 are properly terminated in the characteristic impedance of the quadrature hybrid device, no power is coupled to port 4. If the same magnitude and phase mismatch is provided at both output ports 2 and 3, they also become input ports to the reflected waves produced. FIG. 3 shows that all reflected power ends up in port 4. Port 1 does not see the mismatch so that a perfect termination is maintained at the expense of lost power to port 4. For mismatches at ports 2 and 3 that are not alike, some power will be reflected back to port 1 because amplitude and phase cancellation cannot occur at port 1. This can be a problem when the quadrature hybrid device is used as a power splitter should the load connected to ports 2 or 3 change in some way. This usually turns out to be less serious than it first appears. The reason for this is that, when the quadrature device is used as a splitter, power levels are much lower than when the device is used as a combiner and any reflected power is usually easier to contend with. Port 4 is normally called the isolated port where a dummy load is connected to absorb reflected power. The dummy load must be sized according to the worst case reflected power expected. If the loads connected to ports 2 and 3 are always expected to be perfect, a dummy load at port 4 is not needed meaning that this port may be left unterminated.

Figure 4A:
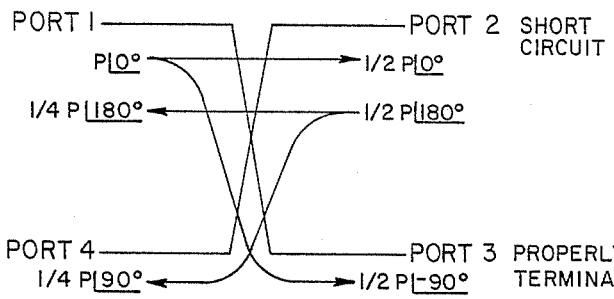
FIGS. 4A and 4B are schematic diagrams of the device of FIG. 1 where ports 2 and 3 are isolated from each others mismatch.
Figure 4B:
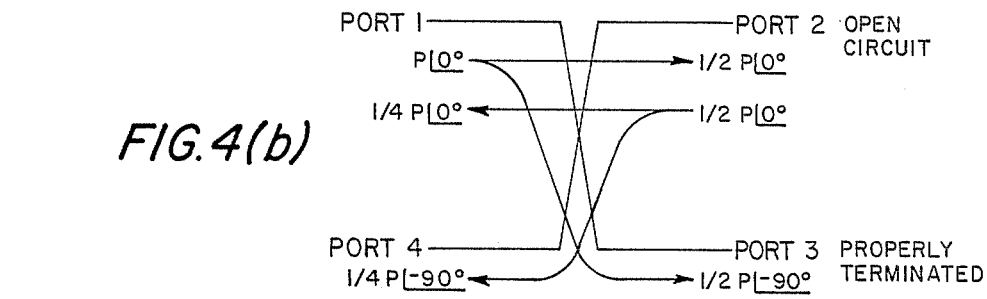

A very important property of the quadrature hybrid device is that the two output ports 2 and 3 in FIG. 1 ideally do not see each other. A mismatch may occur in one output port (port 2 or 3) and the other sees no power as reflected power. This is illustrated in FIGS. 4A and 4B. In FIG. 4A, port 2 takes on the attributes of a short circuit and, in FIG. 4B, port 2 acts as an open circuit. This work because for a signal going back into port 2 or 3, the opposite output port, port 3 or 2, respectively, becomes the new isolated port for the reflected wave. Since all other ports are properly terminated, no power makes it to the new isolated port. The conclusion is that the output ports are isolated from each other. In actual practice the degree of isolation is within the range of 20 to 30 dB.

Figure 5:
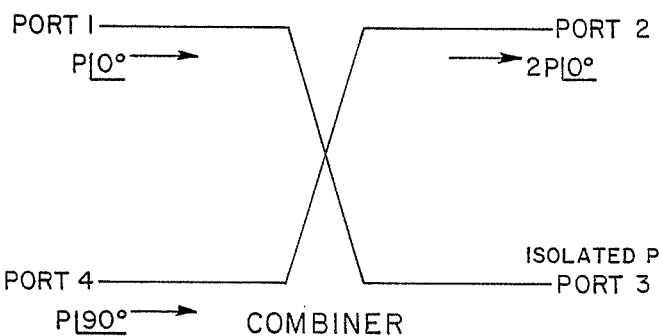
FIG. 5 is a schematic diagram of the device of FIG. 1 configured as a power combiner.

FIG. 5 shows the quadrature hybrid power device used as a power combiner 62. It corresponds to the configuration shown in FIG. 2 where the quadrature device is presented as a splitter. Because the power combiner is a reciprocal device, the analysis is the reverse of the splitter. Two equal amplitude signals 90° split in phase are fed into ports 1 and 4. They are combined in port 2 while port 3 becomes the isolated port. The quadrature device configured as a power combiner retains all of the properties of the splitter and likewise affords input ports isolated with respect to each other.

If a quadrature hybrid device is constructed to be a 3 dB splitter or combiner, power is either split equally in amplitude to two ports or is combined completely from two equal amplitude ports. Should the power levels be unequal in the two input ports of a combiner, some power will be lost in the isolation port dummy load. (This load is often referred to as a reject load.) Since vector voltages are combining to produce power, the power output, $P_o$, is related to the input power level $P_{in2}$ according to:

$$P_o = \left( \sqrt{\frac{P_{in1}}{2}} + \sqrt{\frac{P_{in2}}{2}} \right)^2 \quad (2)$$

The power sent to the isolation port becomes:

$$P_{iso} = \left( \sqrt{\frac{P_{in1}}{2}} - \sqrt{\frac{P_{in2}}{2}} \right)^2 \quad (3)$$

It is easily seen that if $P_{in1} = P_{in2}$, equation (2) reduces so that $P_o$ becomes the sum of the input powers while $P_{iso}$ in equation (3) goes to zero. If either $P_{in1}$ or $P_{in2}$ is zero, half of the power of the remaining active input goes to the output port while the other half is sent to the isolation port with a dummy load. Again, the two input ports remain isolated from each other.

Figure 6:
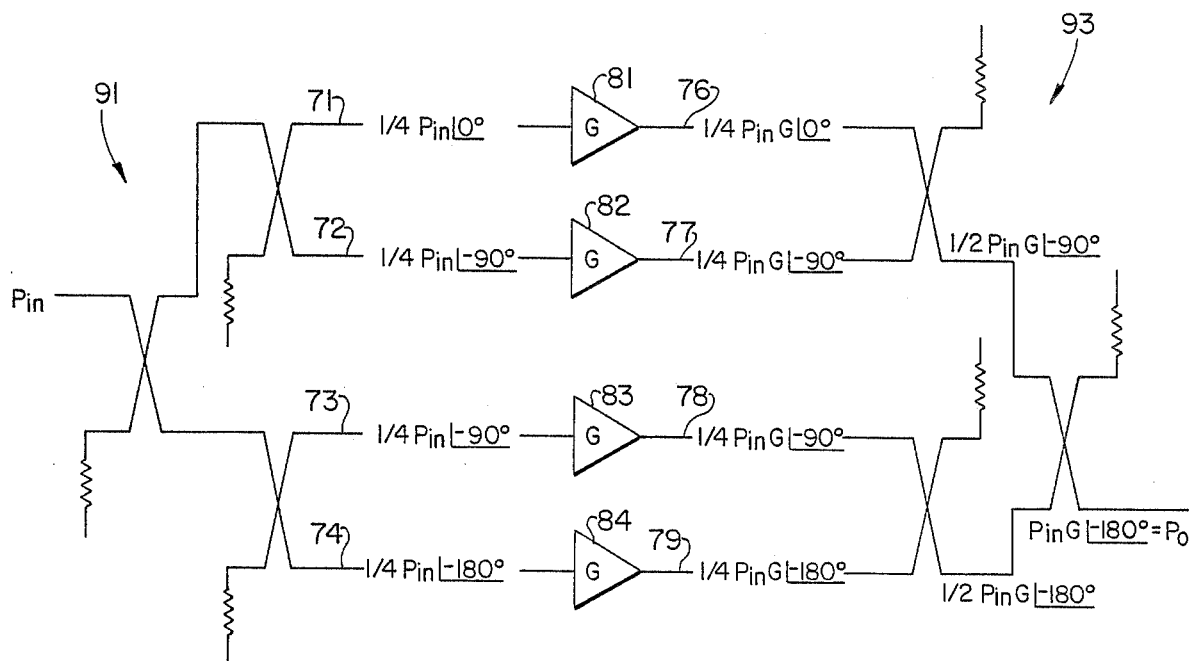
FIG. 6 is a schematic diagram showing the use of three splitters and three combiners connected to preserve phase and shown to drive and combine four smaller identical amplifiers.

More than one quadrature hybrid may be connected in various ways to achieve a desired purpose. For example, FIG. 6 shows how three combiners 91 may be connected to split drive power into four output ports 71 through 74 to drive four amplifiers 81 through 84. The outputs 76 through 79 of the amplifiers may be combined with a like combiner configuration 93 to sum the powers to a single port.

Figure 7:
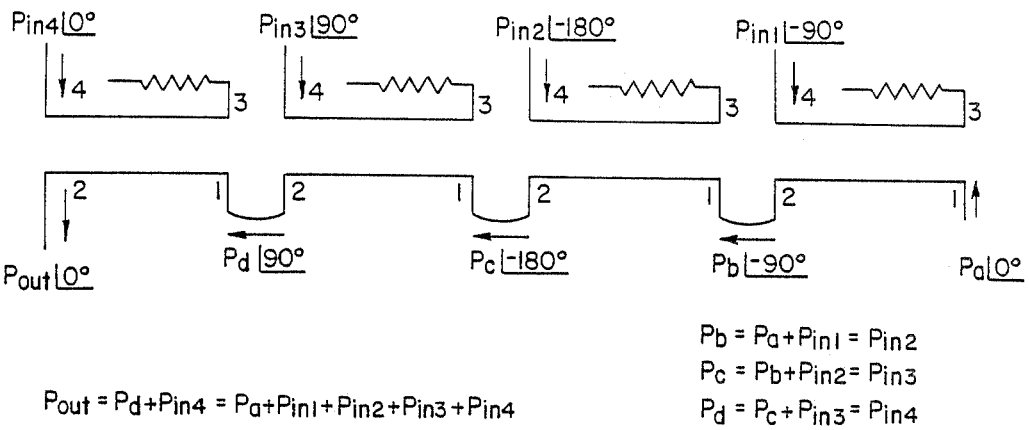
FIG. 7 is a schematic diagram showing four power combining hybrids connected with the output of each feeding one input port of the one to its immediate left. Input power at each input port doubles with the previous one moving right to left so that they are all summed at $P_{out}$.

Making use of the properties of the basic quadrature hybrid splitter/combiner and the relationships of equations (2) and (3) allow for the configuration shown in FIG. 7. Instead of the traditional symbol used for the hybrid thus far, a departure is made in FIG. 7 to reflect more the actual construction of the device. This is helpful in preventing crossed lines interconnecting the cascaded combiners. For all quadrature hybrid devices shown in FIG. 7, the reject or dummy load is connected to the isolated port with respect to the two input ports. Power input doubles moving from right to left so that $P_{in2} = 2P_{in1}$, $P_{in3} = 2P_{in2}$, etc. Power levels are chosen so that they sum to one, but the important relationship is that all input power levels are equivalent to the weight of a binary number made up of ones and zeros. Moving from right to left in a binary word, each succeeding character has twice the numerical weight of the number to the immediate right. In FIG. 7, all input ports are ON. That is to say, if all input ports were controlled by a one or a zero in a binary word, they would all be the same, one or zero. For the sake of easiest association, the convention is made that a logic one means ON and a logic zero means that corresponding input power is OFF. $P_a$ is always on and is not considered to be controlled by a binary digit since it merely represents the total power coming from all previous stages, should they exist.

Figure 8:
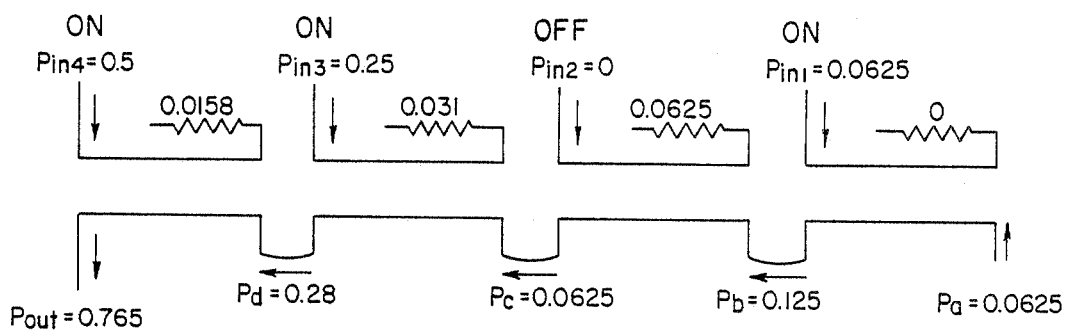
FIGS. 8 through 12 are schematic diagrams similar to FIG. 7 and used to explain the operation of the device in FIG. 7.
Figure 9:
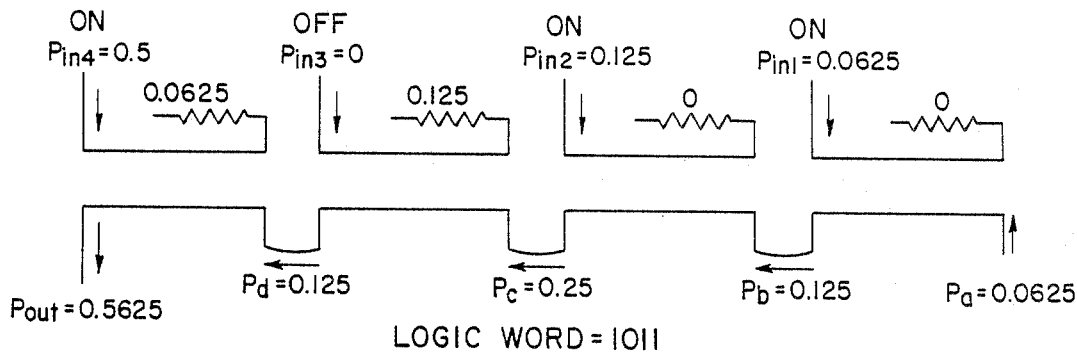
Figure 10:
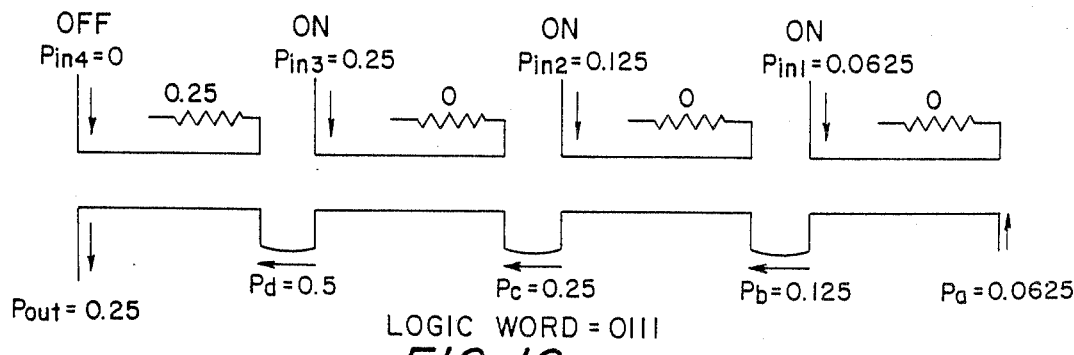
Figure 11:
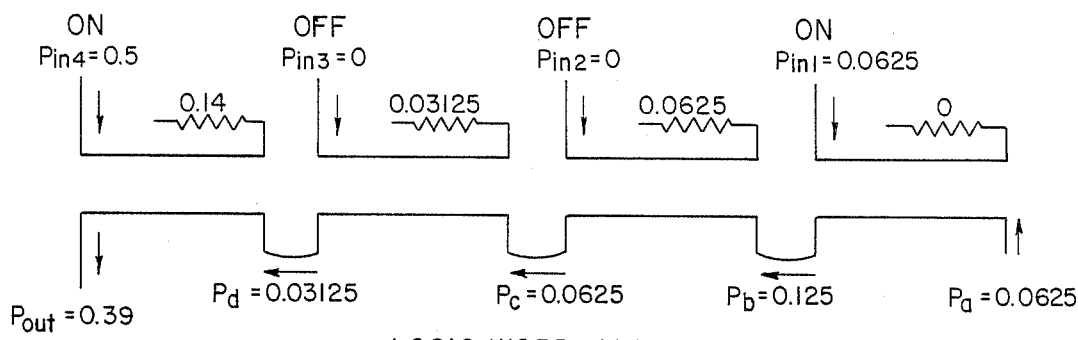
Figure 12:
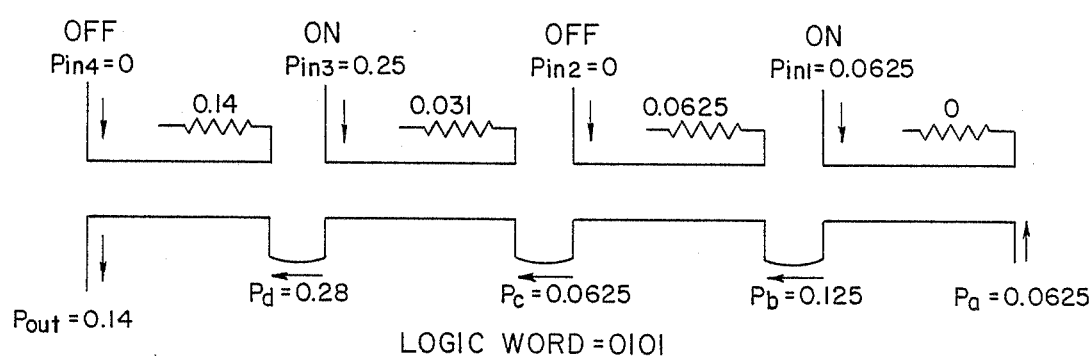

By numerical example, an amplitude modulator is derived that could be controlled by the binary representation of the instantaneous value of the amplitude of an arbitrary waveform. Obviously, a mixture of ones and zeros will result for any sample taken. For a modulator of this type, it is necessary for the power output $P_{out}$ of the combiner arrangement to produce the proper RF power level representing the modulation level sampled. Unless this is true, modulation will not be linear and distortion will result. FIGS. 8 through 12 show several numerical examples of the resultant summed power with one or more inputs turned off by a logic zero assuming the same configuration for the quadrature hybrid devices as shown in FIG. 7. For the sake of simplicity of analysis, the summed power will be taken to be one unit of power or one watt. There are four input ports for a four-bit word of 16 possible binary states. The lowest power input becomes one divided by 16 or 0.0625 watt. Using (2) and (3), each intermediate power level may be found. FIG. 8 for a logic word of 1101 has an output level of 0.765 power unit. The sum of $P_{in}$ is 0.875. For FIG. 9, the logic word is 1011 for a power output of 0.5625 and a power input total of 0.75. FIG. 10 shows an output power 0.25 while the input sum is 0.5. It is interesting to note and essential to the linearity of the modulator that the output power is numerically equal to the square of the input power, i.e., $(0.875)^2 = 0.765$, $(0.75)^2 = 0.5625$, $(0.5)^2 = 0.25$ and, if carried through for all 16 cases of the four-bit word, the relationship holds. At first, it appears that the square law relationship renders the combiner useless as a linear amplitude modulator, but the truth is that digital voltage representations of an arbitrary waveform are just that, voltages that are controlling powers which automatically square the voltages into powers so that the squaring is cancelled. In effect, the digital voltage word is squared into a power word which is perfectly linearly proportional to the power at the summed port, $P_{out}$. The linearity of the modulator does not depend on the type of power sources as long as available power to each port remains precisely double that of the next lower power input port. The proper amount of waste power automatically finds its way to a reject load and not $P_{out}$ to maintain this linearity.

The application of the quadrature hybrid combiners to amplitude modulation may be generalized as follows.

Figure 13:
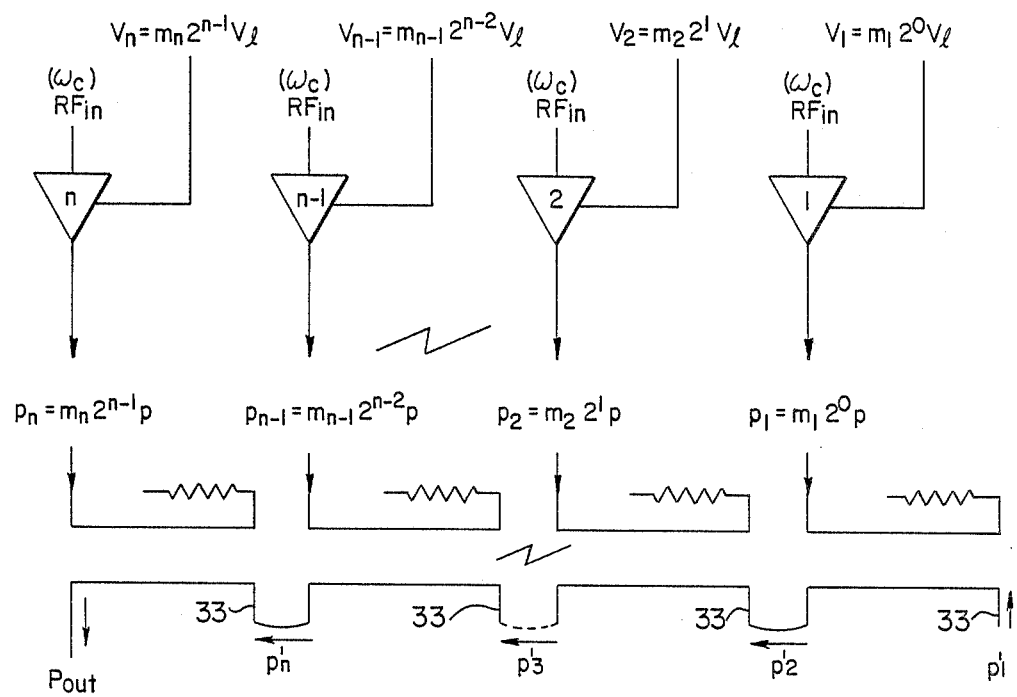
FIG. 13 is a schematic diagram showing a generalized case of a hybrid combiner/modulator driven by n power sources represented by $P_1$ through $P_n$ and gated on and off by $m_1$ through $m_n$.

For the general case, let the letter "n" be the number of bits in the binary word such that n also equals the number of power input ports to an n port combiner. Since the first port will hence forth be referred to as the zeroth port, the ports are numbered from zero to n−1. FIG. 13 represents an n port combiner arranged for amplitude modulation. P is the least significant power level to the "carry" input 33 from imaginary lower level combiners. Let $P_{ci}$ be the total power into the combiner from those amplifiers (1, 2, ... n) gated on. It is apparent that:

$$P_{ci} = p + p_i + p_2 + \ldots p_k + \ldots p_{n-1} + p_n \tag{4}$$

or that:

$$P_{ci} = p + m_1 2^0 p + m_2 2^1 p + \ldots m_k 2^{k-1} p + \ldots \\ m_{n-1} 2^{n-2} p + m_n 2^{n-1} p \tag{5}$$

where:
$m_k = 1$ for the kth amplifier ON
$m_k = 0$ for the kth amplifier OFF
p = the smallest unit of input power
$p_k = m_k 2^{k-1} p$
It follows that:

$$P_{ci} = p \left[ 1 + \sum_{k=1}^{n} m_k 2^{k-1} \right] \tag{6}$$

Let $V_{in}$ be the total binary weighted logic voltage representing the analog level sampled gating the amplifiers (1, 2, ... n) and let $V_l$ be the actual logic level for any logic one. Then:

$$V_{in} = V_1 + V_2 + \ldots V_k + \ldots V_{n-1} + V_n \tag{7}$$

or $$V_{in} = m_1 2^0 V_l + m_2 2^1 V_l + \ldots m_k 2^{k-1} V_l + \ldots \\ m_{n-1} 2^{n-2} V_l + m_n 2^{n-1} V_l \tag{8}$$

where:
$m_k = 1$ for the kth bit = logic 1 or the kth amplifier ON
$m_k = 0$ for the kth bit = logic 0 or the kth amplifier OFF
$V_k = m_k 2^{k-1} V_l$.
Likewise, it follows that:

$$V_{in} = V_l \left[ 1 + \sum_{k=1}^{n} m_k 2^{k-1} \right] \tag{9}$$

It must be remembered that the actual logic level gating each of the n amplifiers is $V_l$ and is the same value corresponding to that required by digital logic families such as TTL and CMOS. All $V_1$ through $V_n$ are binary weighted voltages aligned by position in the binary word and corresponding power level of the associated amplifier.

Let $P_{out}$ = total power out of the combiner/modulator according to which $m_k = 0$ and $m_k = 1$.

Combiner interstage power levels may be found according to the following series of equations derived from (2):

$$P'_2 = \left( \sqrt{\frac{p'_1}{2}} + \sqrt{\frac{p_1}{2}} \right)^2 \tag{10}$$

$$P'_3 = \left( \sqrt{\frac{p'_2}{2}} + \sqrt{\frac{p_2}{2}} \right)^2$$

$$P'_k = \left( \sqrt{\frac{p'_{k-1}}{2}} + \sqrt{\frac{p_{k-1}}{2}} \right)^2$$

$$P'_n = \left( \sqrt{\frac{p'_{n-1}}{2}} + \sqrt{\frac{p_{n-1}}{2}} \right)^2$$

$$P_{out} = \left( \sqrt{\frac{p'_n}{2}} + \sqrt{\frac{p_n}{2}} \right)^2$$

and that $P_{out\ max} = P_{out}$ for all $m_k = 1$.

Further, for the condition that $p'_n = p_n$, all $m_k = 1$, since the sum of all amplifier output powers is necessary to add up to $p_n = p'_n$. It follows that:

$$P_{out\ max} = \left( \sqrt{\frac{p'_n}{2}} + \sqrt{\frac{p_n}{2}} \right)^2 = \left( 2\sqrt{\frac{p_n}{2}} \right)^2 = 2P_n \tag{11}$$

Since $p_n = 2^{n-1} p$ (FIG. 13) for $m_n = 1$.

$$P_{outmax} = 2p_n = 2(2^{n-1} p) = 2^n p \tag{12}$$

Shown another way for the same case, i.e., all $m_k = 1$, no power is lost in the reject loads and:

$$P_{outmax} = P_{ci}, \text{ for all } m_k = 1 \tag{13}$$

From equation (6), it follow that:

$$P_{out\ max} = p \left[ 1 + \sum_{k=1}^{n} 2^{k-1} \right] \tag{14}$$

From the identity:

$$2^n = \left[ 1 + \sum_{k=1}^{n} 2^{k-1} \right] \tag{15}$$

It again follows that:

$$P_{outmax} = 2^n p \tag{16}$$

It was stated earlier and shown by example that the square of the input power to the combiner is numerically equal to the power output and that this square law is actually what provides the perfection of modulation linearity when voltages gate powers on and off. This leads to the following relationship:

$$P_{out} = \frac{P_{ci}^2}{P_{out\,max}} \quad (17)$$

By combining (6) and (16), it follows that:

$$P_{out} = \frac{p^2 \left[ 1 + \sum_{k=1}^{n} m_k 2^{k-1} \right]^2}{2^n P} \quad (18)$$

or $$P_{out} = \frac{p \left[ 1 + \sum_{k=1}^{n} m_k 2^{k-1} \right]^2}{2^n} \quad (19)$$

At this point in the general development of the modulator, expressions are known for $P_{ci}$, $V_{in}$, $P_{out}$ and $P_{out\,max}$ in like terms.

It becomes possible to determine the combiner/modulator system again, G, from logic voltage level to output power, $P_{out}$.

By definition:

$$G = \frac{V_{out}}{V_{in}} \quad (20)$$

$$G = \frac{\sqrt{P_{out} R_L}}{V_{in}}$$

where $R_L$ is the load resistance connected to $P_{out}$.

Substituting equation (19) into equation (20) yields:

$$G = \sqrt{\frac{p \left[ 1 + \sum_{k=1}^{n} m_k 2^{k-1} \right]^2}{2^n}} \frac{\sqrt{R_L}}{V_{in}} \quad (21)$$

or $$G = \sqrt{\frac{pR_L}{2^n}} \left[ 1 + \sum_{k=1}^{n} m_k 2^{k-1} \right] \frac{1}{V_{in}}$$

Substituting equation (9) into equation (21) provides:

$$G = \frac{1}{V_l} \sqrt{\frac{pR_L}{2^n}} \quad (22)$$

Further, from equation (16), $P_{outmax} = 2^n p$ and substituting this into equation (22) gives the following:

$$G = \frac{p}{V_l} \sqrt{\frac{R_L}{P_{out\,max}}} \quad (23)$$

G is seen to be a constant and, therefore, not a function of input power to the combiner or the output power. It is only a function of system constants. G is perfectly linear without taking to account the quantization error that takes place whenever n is finite.

To find the efficiency of the amplitude modulation combiner, it is known by previous numerical example that it is only theoretically perfect for the case when all amplifiers are on, i.e., all $m_k = 1$. Efficiency, $\eta$, is defined to be as follows:

$$\eta = P_{out}/P_{ci}$$

From equations (19) and (6):

$$\eta = \frac{\dfrac{p \left[ 1 + \sum_{k=1}^{n} m_k 2^{k-1} \right]^2}{2^n}}{p \left[ 1 + \sum_{k=1}^{n} m_k 2^{k-1} \right]} = \frac{\left[ 1 + \sum_{k=1}^{n} m_k 2^{k-1} \right]}{2^n} \quad (24)$$

$\eta$ is obviously a function of $m_k$ and is less than unity except when all $m_k = 1$ since power must go into the reject loads to maintain linearity.

For all $m_k = 1$:

$$\eta = \frac{\left[ 1 + \sum_{k=1}^{n} m_k 2^{k-1} \right]}{2^n}$$

and from equation (15):

$$\eta = 2^n/2^n = 1$$

For all $m_k = 0$:

$$\eta = 1/2^n$$

Although an infinitesimally small number for n large, the power actually being wasted in FIG. 13 is most of the power contained in p, the least significant power level. As an example, for a four-bit combiner let the word be arranged according to "dcba" with "a" being the least significant bit (LSB). Combiner/modulator efficiency is shown in Table 1 by using equation (24).

TABLE 1

| Combiner/Modulator Efficiencies | |
|---|---|
| η | dcba |
| 1/16 | 0000 |
| 2/16 | 0001 |
| 3/16 | 0010 |
| 4/16 | 0011 |
| 5/16 | 0100 |
| 6/16 | 0101 |
| 7/16 | 0110 |
| 8/16 | 0111 |
| 9/16 | 1000 |
| 10/16 | 1001 |
| 11/16 | 1010 |
| 12/16 | 1011 |
| 13/16 | 1100 |
| 14/16 | 1101 |
| 15/16 | 1110 |
| 16/16 | 1111 |

When all inputs are off, p is still injected into the "carry" port of the combiner and becomes a source of quantization error of the modulator. p is representative of the modulator's inability to generate a power smaller than p if that power is what is called for the analog waveform being digitized. Likewise, the analog-to-digital converter driving the modulator cannot resolve a waveform amplitude that is less than that represented by the least significant bit. To reduce quantization error, n is made large enough so that p may be made small enough to be imperceivable. For audio, n should be 12 or greater. The minimum value for for video is anticipated to be at least 12.

A digital amplitude modulator has been described by general mathematical derivation. As technology moves toward digitization for signal processing and transmission, the modulator described allows for analog simulation of a digitized signal in a transmitted or broadcasted amplitude modulated system being received by ordinary radio or television receivers.

The modulator described here, because of its port-to-port isolation properties of the power combiners, maintains an impedance of $R_L$ at all ports whether adjacent amplifiers are on or not, therefore, it is useful at all RF frequencies with any class of amplifier. Its speed is limited only by the ability to gate the amplifier in consonance with the analog-to-digital converter sampling rate.

When the digital amplitude modulator described in FIG. 14 is used for television visual transmission, a high level vestigial filter is used to pass the appropriate spectral components of the double sideband signal for NTSC television.

Because of the absolute linearity of the invention, it is expected that the usual non-linearities of television RF amplifiers would be non-existent. Non-linearities such as differential phase, differential gain, group delay, low frequency, high frequency, etc., all disappear. Use of this modulator signifies a reverse trend to high level modulation in TV transmission. It is more than a modulator, however. It is the transmitter with the modulator and RF power amplifier inherently as one.

Many changes and modifications in the above embodiments of the invention can be made without departing from the scope of the invention. For example, linearity depends solely on the relationship that $p_k = 2p_{k-1}$. Should the modulator be desired for a particular purpose to contain a deliberate non-linearity, this non-linearity may be tailored and introduced at the proper $RF_{in}$ points in FIG. 13. Accordingly, the scope is intended to be limited only by the appended claims.

What is claimed is:

1. An amplitude modulator/transmitter for transmitting an information signal comprising:
   a plurality of quadrature hybrid combiners each having a pair of input ports and a single output port, said combiners arranged in cascade;
   carrier means for providing a carrier frequency signal to an input port of each of said combiners, the strength of the signal applied to each combiner increasing by a multiple of two from the initial combiner to the last combiner in said cascade arrangement;
   information means for controlling the delivery of said carrier frequency signals to each of said combiners in accordance with the predetermined information signal;
   terminal output means defined at one of said output ports of the last combiner in said arrangement, said terminal output means providing an output for the summation signal representing the sum of said plurality of carrier frequency signals fed into said combiners; and
   transmitting means for receiving said summation signal for transmission to a remote location.

2. The amplitude modulator/transmitter of claim 1, wherein said carrier frequency is greater than zero.

3. The amplitude modulator/transmitter of claim 2, wherein said carrier frequency is an RF signal.

4. The amplitude modulator/transmitter of claim 1, wherein said summation signal is substantially linear within quantization error.

5. The amplitude modulator/transmitter of claim 1, wherein said quadrature combiners include means for creating port-to-port isolation of said carrier frequency signals.

6. The amplitude modulator/transmitter of claim 1, wherein said transmitting means comprises an antenna.

7. An amplitude modulation system comprising:
   source means for generating an information signal of varying amplitude and frequency;
   carrier means for generating a carrier wave signal having a given frequency;
   a plurality of quadrature combiners, each combiner having a pair of input ports, an isolation port and an output port, said combiners arranged in cascade with the output of one combiner being connected to one of said input ports of the next combiner;
   a plurality of gate means each connected to the output of said carrier means for receiving said carrier wave signal and passing said signal to the free input of one of said combiners under the control of said information signal;
   connecting means for connecting the inputs of said gate means to said source means for receiving said information signal; and
   load means for receiving the output of the last combiner in said cascade arrangement, said output representing the sum of the inputs to said combiners.

8. The amplitude modulation system of claim 7, wherein the frequency of said carrier means is greater than the highest frequency of said information signal.

9. The amplitude modulation system of claim 7, wherein said source means comprises:
   analog signal means for producing an analog information signal into a digital signal made up of digital words having a desired number of bits.

10. The amplitude modulation system of claim 9, wherein said connecting means includes means for delivering said bits of information to said gate means with a particular bit being associate with a particular gate means.

11. The amplitude modulation system of claim 9, wherein said analog signal means comprises a microphone.

12. The amplitude modulation system of claim 9, wherein said analog signal means comprises a video generator.

13. The amplitude modulation system of claim 7, wherein said load comprises an antenna.

14. An amplitude modulator/transmitter for transmitting an information signal comprising:
   a plurality of quadrature hybrid combiners each having a pair of input ports and a single output port, said combiners arranged in cascade;
   carrier means for providing a carrier frequency signal to an input port of each of said combiners, the strength of the signal applied to each combiner increasing by a multiple of two from the initial combiner to the last combiner in said cascade arrangement, said carrier means including an RF frequency generator for generating an RF signal having a frequency and phase of predetermined value, and a plurality of amplifiers, one associated with each of said combiners for amplifying said RF signal by a predetermined amount, each of said amplifiers producing at its output one of said carrier frequency signals for introduction into one of said combiners;

information means for controlling the delivery of said carrier frequency signals to each of said combiners in accordance with the predetermined information signal;

termination output means defined at one of said output ports of the last combiner in said arrangement, said terminal output means providing an output for the summation signal representing the sum of said plurality of carrier frequency signals fed into said combiners; and transmitting means for receiving said summation signal for transmission to a remote location.

15. The amplitude modulator/transmitter of claim 14, wherein said information means comprises:

means for producing a time varying analog signal representative of information to be transmitted;

means for converting said analog signal into a digital signal comprised of digital words that approximate said analog signal;

means for converting said digital signal into a plurality of bit signals, each signal being representative of a bit used to define said digital words; and control means responsive to said bit signals for controlling the on/off operation of said amplifiers to control the passage of said amplified RF signals to said combiners.

* * * * *